United States Patent
Shahparnia et al.

(10) Patent No.: US 9,190,997 B2
(45) Date of Patent: Nov. 17, 2015

(54) CAPACITIVE SENSOR INTERFERENCE DETERMINATION

(75) Inventors: Shahrooz Shahparnia, Campbell, CA (US); Kirk Hargreaves, Mountain View, CA (US)

(73) Assignee: Synaptics Incorporated, San Jose, CA (US)

(*) Notice: Subject to any disclaimer, the term of this patent is extended or adjusted under 35 U.S.C. 154(b) by 659 days.

(21) Appl. No.: 13/562,207

(22) Filed: Jul. 30, 2012

(65) Prior Publication Data

US 2012/0293190 A1    Nov. 22, 2012

Related U.S. Application Data

(63) Continuation of application No. 12/491,102, filed on Jun. 24, 2009, now Pat. No. 8,258,797.

(51) Int. Cl.

| | |
|---|---|
| *G01R 27/26* | (2006.01) |
| *H03K 17/96* | (2006.01) |
| *G01D 3/08* | (2006.01) |
| *G01D 5/24* | (2006.01) |
| *G06F 3/044* | (2006.01) |

(52) U.S. Cl.
CPC .............. *H03K 17/9622* (2013.01); *G01D 3/08* (2013.01); *G01D 5/24* (2013.01); *G06F 3/044* (2013.01); *H03K 2217/96058* (2013.01); *Y10T 29/49117* (2015.01)

(58) Field of Classification Search
CPC .................. G06F 3/044; G06F 3/0416; G06F 2203/04104; G06F 3/0488; G01R 31/312; G01R 27/2605; G01D 3/08
See application file for complete search history.

(56) References Cited

U.S. PATENT DOCUMENTS

| | | | |
|---|---|---|---|
| 5,255,227 A * | 10/1993 | Haeffele | 365/200 |
| 5,659,254 A | 8/1997 | Matsumoto et al. | |
| 7,271,660 B1 | 9/2007 | Carroll | |
| 7,277,264 B2 | 10/2007 | Kitagawa | |
| 7,834,697 B1 | 11/2010 | Lipka | |
| 8,258,797 B2 | 9/2012 | Shahparnia et al. | |
| 2003/0011378 A1 * | 1/2003 | Ishio et al. | 324/519 |
| 2003/0016849 A1 | 1/2003 | Andrade | |
| 2005/0213275 A1 | 9/2005 | Kitagawa | |
| 2007/0247171 A1 | 10/2007 | O'Dowd et al. | |
| 2010/0327882 A1 | 12/2010 | Shahparnia et al. | |
| 2012/0206154 A1 | 8/2012 | Pant et al. | |
| 2012/0293190 A1 | 11/2012 | Shahparnia et al. | |

OTHER PUBLICATIONS

Office Action, U.S. Appl. No. 13/024,539, mailed Mar. 14, 2013, 14 pages.
Office Action, U.S. Appl. No. 131024,539, mailed Sep 1, 2015, 33 pages.

* cited by examiner

*Primary Examiner* — Tung X Nguyen

(57) ABSTRACT

A processing system for a capacitive input device is described. The capacitive input device includes a plurality of sensor electrodes configured to detect input objects in a sensing region. The processing system configured to transmit a signal on a transmitter sensor channel of the capacitive input device. The processing system is also configured to receive the signal on a receiver sensor channel of the capacitive input device, wherein the receiver sensor channel is coupled with an amplifier. The processing system is also configured to determine if a level of interference has been received by the receiver sensor channel in conjunction with receipt of the signal.

10 Claims, 6 Drawing Sheets

500

```
┌─────────────────────────────────────────────────┐
│ TRANSMIT A SIGNAL ON A TRANSMITTER SENSOR       │
│ CHANNEL OF A CAPACITIVE SENSOR.                 │
│ 510                                             │
└─────────────────────────────────────────────────┘
                        ↓
┌─────────────────────────────────────────────────┐
│ RECEIVE THE SIGNAL ON A RECEIVER SENSOR CHANNEL │
│ OF THE CAPACITIVE SENSOR, WHEREIN THE RECEIVER  │
│ SENSOR CHANNEL IS COUPLED WITH AN AMPLIFIER.    │
│ 520                                             │
└─────────────────────────────────────────────────┘
                        ↓
┌─────────────────────────────────────────────────┐
│ EXAMINE BEHAVIOR OF THE AMPLIFIER FOR NON-      │
│ LINEARITY TO DETERMINE IF A LEVEL OF INTERFERENCE│
│ HAS BEEN RECEIVED BY THE RECEIVER SENSOR        │
│ CHANNEL IN CONJUNCTION WITH RECEIPT OF THE      │
│ SIGNAL.                                         │
│ 530                                             │
└─────────────────────────────────────────────────┘
                        ↓
┌ ─ ─ ─ ─ ─ ─ ─ ─ ─ ─ ─ ─ ─ ─ ─ ─ ─ ─ ─ ─ ─ ─ ─ ┐
  SET AN INDICATOR IN RESPONSE TO AN OCCURRENCE
│ OF THE NON-LINEARITY.                          │
  540
└ ─ ─ ─ ─ ─ ─ ─ ─ ─ ─ ─ ─ ─ ─ ─ ─ ─ ─ ─ ─ ─ ─ ─ ┘
```

```
COUPLE AN AMPLIFIER WITH A RECEIVER SENSOR CHANNEL OF
AN INTERFERENCE PROCESSOR SYSTEM, THE AMPLIFIER
CONFIGURED WITH A FIRST INPUT FOR RECEIVING A SIGNAL
FROM THE RECEIVER SENSOR CHANNEL AND A SECOND INPUT
FOR A REFERENCE VOLTAGE.
610
```

↓

```
COUPLE A CURRENT DIFFERENTIAL AMPLIFIER WITH AN
OUTPUT OF THE AMPLIFIER, THE CURRENT DIFFERENTIAL
AMPLIFIER CONFIGURED TO OUTPUT TWO DIFFERENTIAL
CURRENTS REPRESENTING DIFFERENTIALS OF CURRENTS
UTILIZED IN THE AMPLIFIER.
620
```

↓

```
COUPLE A CURRENT COMPARATOR WITH THE CURRENT
DIFFERENTIAL AMPLIFIER, THE CURRENT COMPARATOR
CONFIGURED TO COMPARE THE TWO DIFFERENTIAL CURRENTS
TO TWO REFERENCE CURRENTS TO DETERMINE WHETHER A
NON-LINEARITY EXISTS IN THE AMPLIFIER.
630
```

↓

```
COUPLE A HARDWARE INTERFERENCE INDICATOR WITH THE
CURRENT COMPARATOR, THE HARDWARE INTERFERENCE
INDICATOR CONFIGURED TO OUTPUT A INTERFERENCE
INDICATION SIGNAL IN RESPONSE TO COMPARISONS OF THE
REFERENCE CURRENTS AND THE DIFFERENTIAL CURRENTS
INDICATING PRESENCE OF THE NON-LINEARITY.
640
```

FIG. 6

CAPACITIVE SENSOR INTERFERENCE DETERMINATION

CROSS-REFERENCE TO RELATED APPLICATIONS (CONTINUATION)

This application claims priority and is a continuation to the co-pending patent application Ser. No. 12/491,102, entitled "Capacitive Sensor Interference Determination," with filing date Jun. 24, 2009, and assigned to the assignee of the present application, the disclosure of which is hereby incorporated herein by reference.

This application is related to U.S. patent application Ser. No. 13/024,539 entitled INPUT DEVICE INTERFERENCE DETERMINATION, by Vivek Pant et al., assigned to the assignee of the present invention, filed Feb. 10, 2011.

BACKGROUND

Capacitive sensor devices, otherwise known as touch sensor devices or proximity sensors are widely used in modern electronic devices. A capacitive sensor device is often used for touch based navigation, selection, or other input, in response to a finger, stylus, or other object being placed on or in proximity to a sensor of the capacitive sensor device. In such a capacity, capacitive sensor devices are often employed in computers (e.g. notebook/laptop computers), media players, multi-media devices, remote controls, personal digital assistants, smart devices, telephones, and the like.

Such capacitive sensor devices are often operated, at least in part, by a controller component such as an application specific integrated circuit (ASIC). The inputs and/or outputs of the controller component are typically used to drive the portions of the sensor devices and to measure capacitance(s) from the sensor devices. The measurements may include multiple inputs and/or outputs (e.g. receivers, transmitters and guards, etc.) and can include absolute and transcapacitive measurements.

With respect to transcapacitance, some capacitive implementations utilize transcapacitive sensing methods based on the capacitive coupling between sensor conductors. Transcapacitive sensing methods are sometimes also referred to as "mutual capacitance sensing methods." A transcapacitive sensing method operates, for example, by detecting the electric field coupling one or more transmitting sensor conductors with one or more receiving sensor conductors in a sensor array. Proximate objects may cause changes in the electric field, and produce detectable changes in the transcapacitive coupling. Sensor conductors may transmit as well as receive, either simultaneously or in a time multiplexed manner. Sensor conductors that transmit are sometimes referred to as the "transmitting sensor electrodes," "driving sensor electrodes," "row drivers," "transmitters," or "drivers"—at least for the duration when they are transmitting. Other names may also be used, including contractions or combinations of the earlier names (e.g. "driving electrodes" and "driver electrodes." Sensor conductors that receive are sometimes referred to as "receiving sensor electrodes," "receiver electrodes," "column receivers," or "receivers"—at least for the duration when they are receiving. Similarly, other names may also be used, including contractions or combinations of the earlier names. In one implementation, a transmitting sensor electrode is modulated relative to a system ground to facilitate transmission. In another implementation, a receiving sensor electrode is not modulated relative to system ground to facilitate receipt.

With respect to a controller, the inputs/outputs of the controller may be configured at different times to measure different capacitances from the sensor device. For example, a grid of capacitive sensor elements of a capacitive sensor device's sensor array can be scanned to determine individual transcapacitances that can be integrated to capacitively image an input object or objects that are touching or proximate to the capacitive sensor array of the capacitive sensor device.

BRIEF DESCRIPTION OF THE DRAWINGS

The accompanying drawings, which are incorporated in and form a part of the Description of Embodiments, illustrate various embodiments of the present invention and, together with the Description of Embodiments, serve to explain principles discussed below. The drawings referred to in this Brief Description of Drawings should not be understood as being drawn to scale unless specifically noted.

FIG. 5 is a flow diagram a method of determining interference in a capacitance sensor device, according to an embodiment.

FIG. 6 is a flow diagram of a method of fabricating an interference determining processor system for a capacitive sensor device, according to an embodiment.

DESCRIPTION OF EMBODIMENTS

Figure 1:
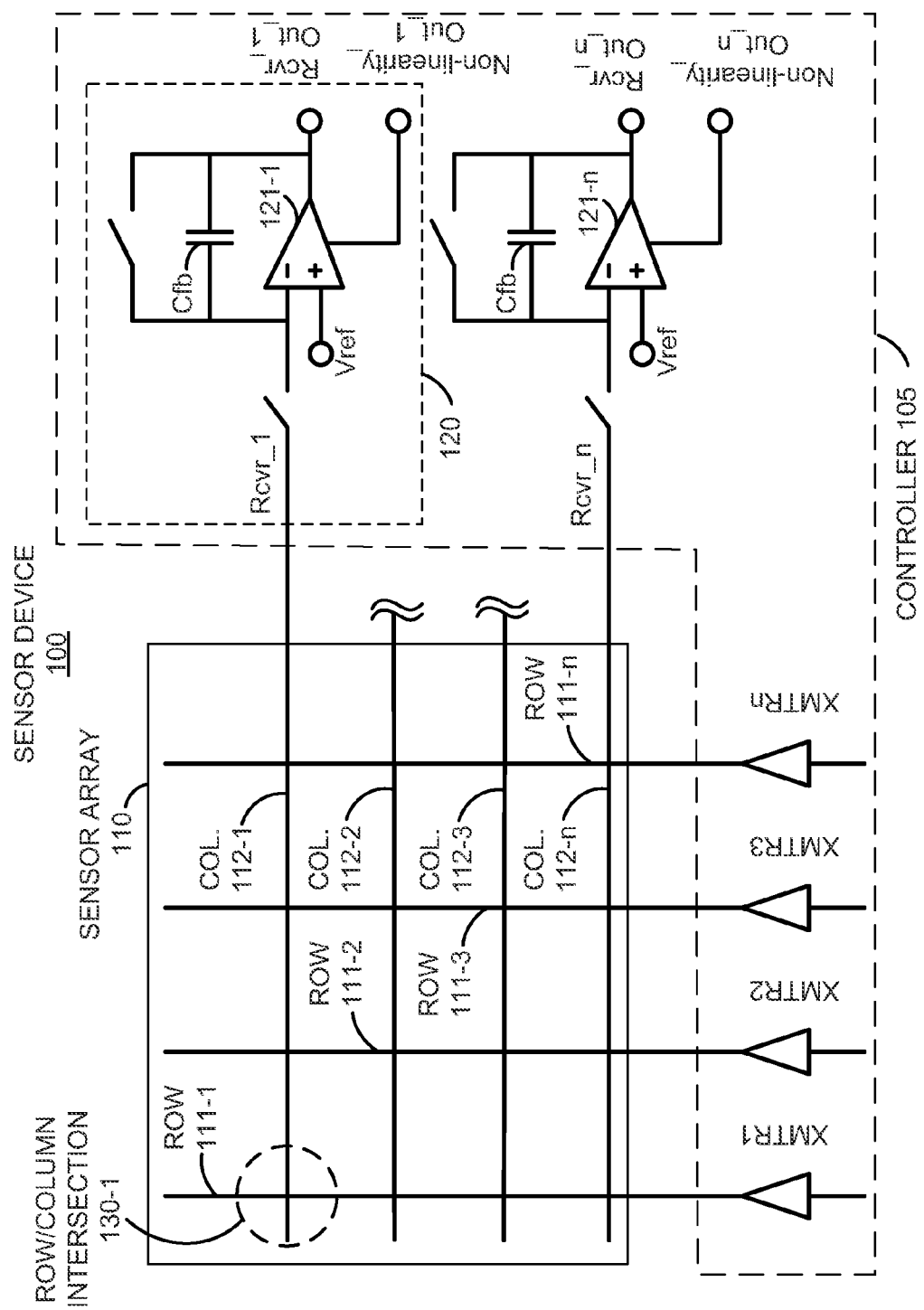
FIG. 1 is a block diagram of an example capacitive sensor device, according to an embodiment.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Unless specifically stated otherwise as apparent from the following discussions, it is appreciated that throughout the present Description of Embodiments, discussions utilizing terms such as "transmitting," "receiving", "determining," "using," "comparing" or the like, often refer to the actions and processes of discrete electrical components (e.g., amplifiers, capacitors, resistors, and the like) or an arrangement of components in an integrated circuit (e.g., an application specific integrated circuit (ASIC)) or similar electronic device. The electronic device transmits, receives, manipulates and/or transforms signals represented as physical (electrical) quantities within the electronic device's circuits, components, logic, and the like, into other signals similarly represented as physical electrical quantities within the electronic device or within or transmitted to other electronic or computing devices.

Overview of Discussion

Capacitive sensor devices are susceptible to interference that is received along with a sensed capacitance. Interference can cause sampled capacitances that are measured from a sensor array to be inaccurate and/or unusable when an amplifier coupled with a receiver output of the sensor array is forced into a non-linear range of amplification due to the presence of interference in a received signal that is being amplified. Conventionally, this can be problematic when measuring capacitances from a sensor array, as a sampled capacitance value may be invalid due to corruption by excess interference which can either saturate the receiver amplifier or prevent it from settling to a level at which an accurate measurement can be made.

Herein, methods and circuits are described that can be used to detect the presence of interference in a capacitance measuring system. When employed in a controller for a capacitive sensor device, these methods and circuits operate to detect corrupted measurement samples right at the time that the corruption due to interference occurs. In this manner, an indication of an interference corrupted measurement, due to either insufficient settling or saturation, is generated contemporaneously with the sampling period for the measurement. This alerts the controller and presents the opportunity to take any one of a number of actions with respect to the interference corrupted measurement sample.

Discussion will begin with a description of an example capacitive sensor device. This discussion will include description of example input signals and output signals. Operation of the receiver amplifier will be described in conjunction with description of an example timing diagram. A block diagram of an example capacitive sensor interference determining circuit used in conjunction with a receiver amplifier of a capacitive sensor device will be presented. Discussion will then be directed toward an example method of determining interference in a capacitance sensor device, in accordance with the embodiments described herein. Finally, an example method of fabricating an interference determining processor system for a capacitive sensor device, in accordance with the embodiments described herein, will be discussed.

Example Capacitive Sensor Device

FIG. 1 is a block diagram of an example capacitive sensor device 100, according to an embodiment. Capacitive sensor device 100 comprises a controller 105 and a sensor array 110. In one embodiment, controller 105 is implemented as an integrated circuit, such as application specific integrated circuit (ASIC). Controller 105 comprises a transmit side and a receive side. The transmit side includes a plurality of drivers, illustrated as transmitters (XMTR1 to XMTRn), each of which is configured to generate and transmit a carrier signal on a row driver 111 (e.g., an active sensor conductor row 111). The receive side of controller 105 includes a plurality of receiver amplifiers, illustrated as receiver amplifiers (121-1 to 121-n), that amplify a received signals from a column receiver 112 (e.g., an active sensor conductor column 112) of sensor array 110.

As illustrated, each receiver amplifier 121 includes a non-inverting input coupled with a reference voltage (Vref). Each receiver amplifier 121 also includes a feedback capacitor (Cfb) coupled between the output and the inverting input of the receiver amplifier 121. Additionally, each receiver amplifier 121 is configured with a switch across Cfb that can be closed to create a reset condition. A boxed detail area 120 surrounds receiver amplifier 121-1 and its inputs and outputs. Detail 120 is illustrated in greater specificity in FIGS. 2 and 4.

As shown in FIG. 1, sensor array 110 comprises a plurality of sensor conductors arranged in a matrix of rows 111 (111-1, 111-2, 111-3 . . . 111-n) and columns 112 (112-1, 112-3, 112-3 . . . 112-n). As described above, when active, a row 111 is often referred to as a row driver and a column, when active, is often referred to as a column receiver. Although four rows 111 and four columns 112 are illustrated, it is appreciated that in other embodiments a greater or lesser number of row 111 and/or column 112 can be included in sensor array 110. Coupled with each row 111 is a driver in the form of a transmitter, such as XMTR1, which drives a carrier signal into the row 111 to which it is coupled. This carrier signal is capacitively coupled with the columns 112, such as at row/column intersection 130-1, and then output (Rcvr_1 to Rcvr_n) on a column receiver 112 to be amplified by a receiver amplifier 121, that is coupled with a particular column 112. Due to space constraints, only two receiver amplifiers 121 are illustrated in FIG. 1. However it is appreciated that controller 105 may be configured with a separate receiver amplifier 121 coupled with each column 112 of sensor array 110.

In operation, on the transmit side a carrier is generated and driven into the rows 111 of the matrix-arranged sensor array 110 by transmitters XMTR1 through XMTRn. The presence of one or more objects, such as fingers, touching or in proximity to sensor array 110 adds to the current already injected into the rows 111 of sensor array 110. The added current is integrated in multiple receiver amplifiers connected to the rows 111 of sensor array 110. By utilizing a timed scanning pattern simultaneously on both the transmitters (XMTR1 though XMTRn) and receiver amplifiers 121, a capacitive image scan of objects touching or in close proximity to sensor array 110 can be generated through evaluation of a plurality of measured samples taken while driving sensor array 110.

In operation of controller 105, according to one embodiment, on each receiver channel (Rcvr_1 through Rcvr_n), the output (i.e. Rcvr_Out_1) of the receiver amplifier 121 that is coupled with the receiver channel is further processed by controller 105. This further processing can include removing the carrier signal with a demodulator and an anti-aliasing low pass filter. This further processing can also include filtering an input device signal (referred to herein as a finger signal). The filtered finger signal is held by an analog to digital convertor to create a digital equivalent output to be used by firmware of controller 105 or another electronic device. It is appreciated that circuitry for performing such filtering and analog to digital conversion is well known in the art and is not illustrated herein so as not to obscure other aspects of controller 105.

During operation of capacitive sensor device 100, interference or high amplitude external signals may be directly coupled into sensor array 110 or coupled into sensor array 110 via an object such as a finger that is proximate to or touching sensor array 110. When excessive amounts of such interference are coupled into the receiver channels this can corrupt the signals output by receiver amplifiers 121. This corruption can occur through two different mechanisms. First, high amplitude interference can saturate (peg) the output of a receiver amplifier 121, thus obscuring and invalidating a signal measured with respect to a touching or proximate object, such as a finger. Second, interference may force a slewing effect on the output of receiver amplifier 121 (e.g., Rcvr_Out_1) if the interference has sharp transitioning edges. In this case, the output of receiver amplifies 121 cannot settle to a final value within the right time frame to be sampled. Thus, this lack of settling can also obscure and invalidate a signal measured with respect to a touching or proximate object, such as a finger.

As illustrated in FIG. 1, receiver amplifiers 121 are equipped with an additional output, Non-linearity_Out, which is set when a receiver amplifier 121 (e.g., 121-1) experiences amplification non-linearities either due to saturation or due to a lack of settling during the time of a sample. The Non-linearity_Out output of receiver amplifiers 121 alerts controller 105 that the presence of excessive interference has been determined. This determination allows controller 105 to deal with this interference according to one or more predefined or dynamic responses which may be implemented in hardware or firmware of controller 105 or another electronic device communicatively coupled with controller 105. By way of example and not of limitation, in various embodiments, a high output on Non-linearity_Out can trigger rejection of the Rcvr_Out signal (e.g., controller 105 can disregard or not sample the output of Rcvr_Out or can disallow a sample from Rcvr_Out to be filtered/averaged with previous samples); controller 105 can count occurrences of interference contaminated/corrupted samples (e.g., the number of occurrences within an analog to digital conversion cycle) and take a predetermined action based on the count; and/or hardware or firmware based algorithms of controller 105 or another electronic device can normalize the value of interference corrupted samples (e.g., by averaging surrounding uncorrupted samples) before using them.

Figure 2:
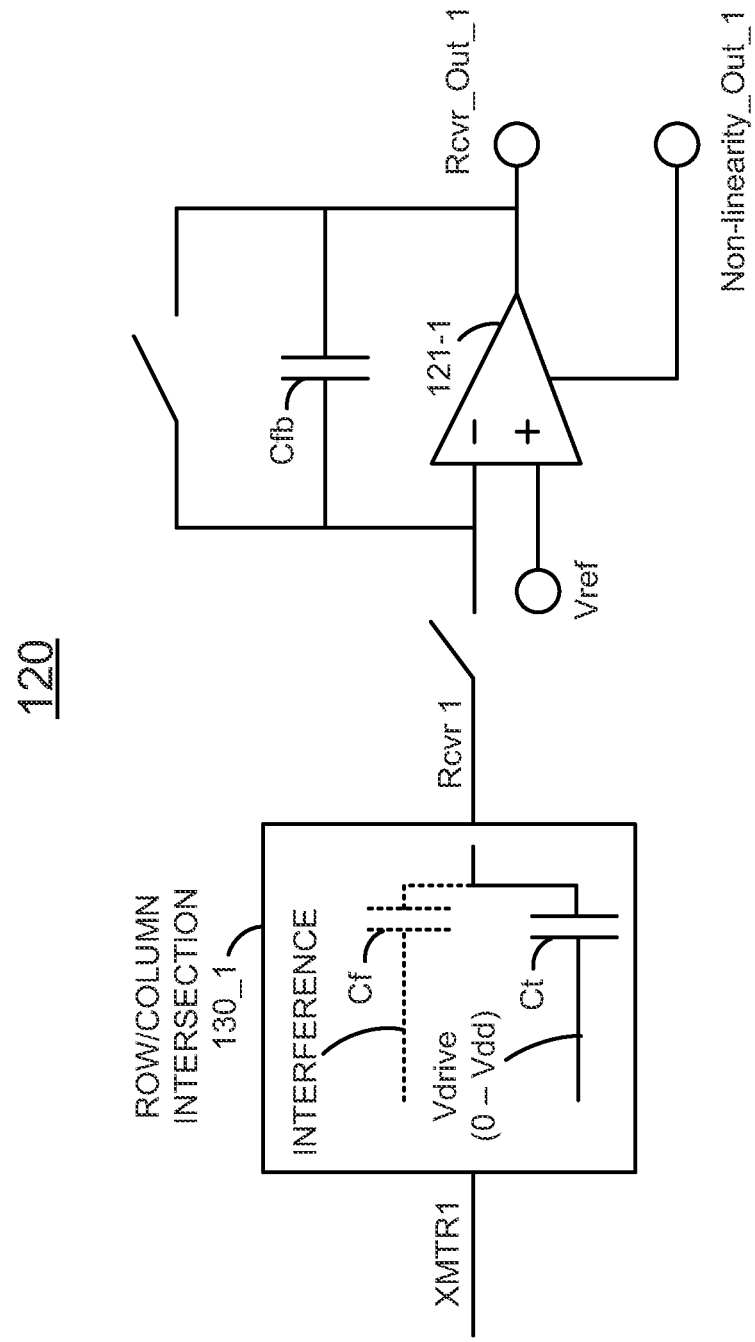
FIG. 2 is a block diagram of an example receiver amplifier of a capacitive sensor device, according to an embodiment.
Figure 3:
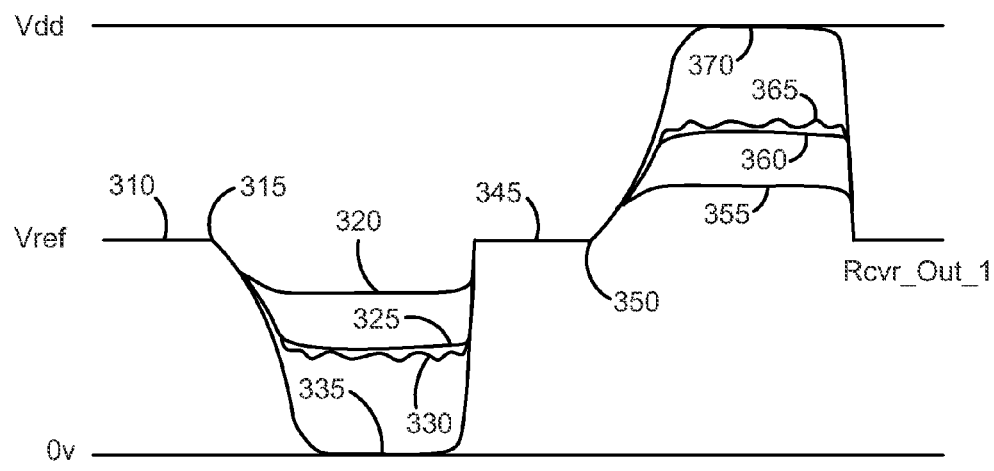
FIG. 3 is an example voltage and timing diagram for a receiver amplifier, according to an embodiment.
Figure 3:
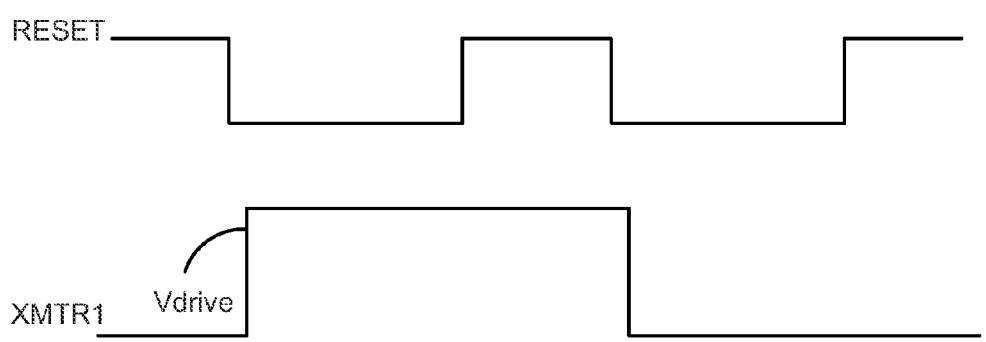
Figure 4:
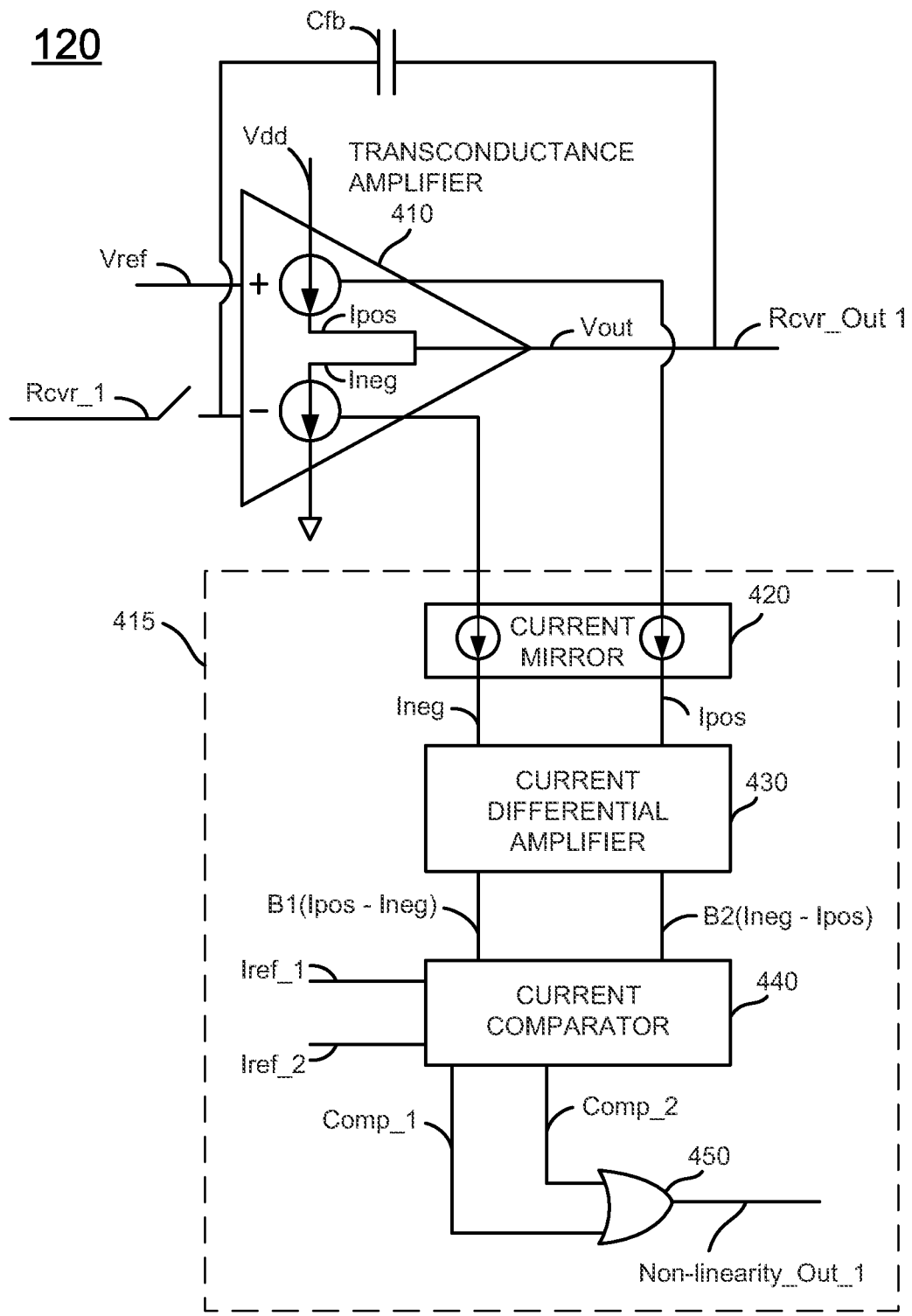
FIG. 4 is a block diagram of an example capacitive sensor interference determining circuit implemented with a receiver amplifier of a capacitive sensor device, according to an embodiment.

The operation of a receiver amplifier 121 and an example of the implementation of the Non-linearity_Out output of a receiver amplifier 121 is described in greater specificity in conjunction with description of detail region 120 in FIGS. 2 and 4, the example timing diagram of FIG. 3, and the example method of operation of FIG. 5.

FIG. 2 is a block diagram of detail 120, which shows an example receiver amplifier 121-1 of a capacitive sensor device, according to an embodiment. The block diagram of detail 120 also shows the inputs and outputs to receiver amplifier 121-1 and is included to illustrate components of input signal, Rcvr_1, that are received from a row/column intersection, such as row/column intersection 130-1, of sensor array 110. It is appreciated that sensing provided by row/column intersection 130-1 is not limited to the actual intersection of a row 111 and column 112, but instead encompasses some vicinity surrounding the intersection. An example of this "vicinity" is illustrated two-dimensionally by the dashed circle 130-1 of FIG. 1. It is appreciated, however that this vicinity also extends in a third dimension which is not illustrated by the plan view of FIG. 1. Likewise, it is appreciated that row/column intersection 130-1 is illustrated as only a single example of a row/column intersection 130 and that a sensor array, such as sensor array 110, typically includes a plurality of row/column intersections 130.

Drive signals (e.g. from XMTR1) are driven in the range of 0 v to Vdd. Thus, Rcvr_1 varies between 0 and Vdd due to the component attributable to the drive signal that has been capacitively coupled from a row 111 to a column 112 of sensor array 110. Due to this, when driven, Rcvr_1 will include a voltage (Vdrive) that varies between 0 and Vdd and will include a capacitance (Ct) that is attributable to the internal capacitance of sensor array 110 (i.e., the capacitance between the transmit row 111-1 and receive column 112-1 to which receiver amplifier 121-1 is coupled). Additionally, some level of interference (which may increase due to being coupled through a finger) will also be coupled into sensor array 110 and included in the signal of Rcvr_1. When an object/objects, generically described herein as a finger, is capacitively coupled with the sensor element (e.g., row/column intersection 130-1 in the illustrated example) of sensor array 110 that that outputs the Rcvr_1 signal, Rcvr_1 will additionally be modulated with some amount of signal attributable to the finger and the environment, and Rcvr_1 will also include a capacitive component (Cf) that is attributed to the finger.

Receiver amplifier 121-1 is a transconductance amplifier. As such, the nominal Rcvr_Out output of receiver amplifier 121-1, absent interference or other input to sensor array 110, can be defined by either Equation 1 or Equation 2, depending on which direction the drive signal (e.g., XMTR1) is being driven:

$$\text{Rcvr\_Out\_1} = (-Ct/Cfb)Vdd + Vref \quad \text{Equation 1}$$

$$\text{Rcvr\_Out\_1} = (Ct/Cfb)Vdd + Vref \quad \text{Equation 2}$$

Consider an example where Vref=Vdd/2; Ct=2 pf; and Cfb=16 pf. With reference to Equations 1 and 2, in such an example, the range of the signal Rcvr_Out_1 can vary from a high of VDD/2+Ct/Cfb*VDD to a low of VDD/2−Ct/Cfb*VDD. Thus, by substituting the example values for Ct and Cfb, the equation for the high value becomes Vdd/2+Vdd/8=5/8 Vdd, and the equation for the low value becomes Vdd/2−Vdd/8=3/8 Vdd. Thus, without any input such as a touch, the output, Rcvr_Out_1, of receiver amplifier 121-1 should exist within or very near this range.

For purposes of example, consider an embodiment where adding a finger capacitance, Cf, changes the input capacitance to receiver amplifier 121-1 by increasing it by another 2 pf. Thus the maximum value of Rcvr_Out_1 becomes Vdd/2+Vdd/4=3/4 Vdd and the minimum value of Rcvr_Out_1, becomes Vdd/2−Vdd/4=1/4 Vdd. When receiver amplifier 121-1 is not slewing, the output will substantially settle in this range in a pre-defined time period, such as, for example, 1 ms, after which time a sample can be taken. Some amount of interference is typically present in the Rcvr_Out_1 signal, however, when an erratic interference signal is present that causes slewing, receiver amplifier 121-1 will have a Rcvr_Out_1 signal that is near the above described range, but is not settled (i.e., it is oscillating or varying at an unacceptable level that prevents sampling of a reliable measurement). Additionally, when receiver amplifier 121-1 is saturated with interference, Rcvr_Out_1 will be saturated to either Vdd or zero volts, both of which are well outside the expected range.

FIG. 3 is an example voltage and timing diagram for a receiver amplifier, such as receiver amplifier 121-1 of detail 120 (FIGS. 1 and 2), according to an embodiment. For purposes of example, Vref will be defined as Vdd/2, as was described above in conjunction with FIG. 2. Thus, following the example embodiment as described above in FIG. 2, the Rcvr_Out_1 output varies from 0 to Vdd. FIG. 3 shows various possible states of Rcvr_Out_1, and it is appreciated that only one of the states represented by signals 320, 325, 335, and 330 can occur at a time. Likewise, only one of the states represented by signals 355, 360, 365, and 370 can occur at a time.

Beginning from the left of FIG. 3, at location 310, a reset condition has brought Rcvr_Out_1 to Vdd/2. At 315, XMTR1 begins a positive drive on sensor array 110. Signal 320 shows the level of baseline static that is present on the amplified signal Rcvr_Out_1, which is an example of the signal level of Rcvr_Out_1 without the presence of a finger or other input object. Although depicted as settled, it is appreciated that such baseline static can also be unsettled in some embodiments. Signal 325 indicates an example settled level of Rcvr_Out_1 when a finger or other input object is present and sensed. Signal 325 is settled enough that it can be accurately sampled during sample period 340. Following the example outlined above in conjunction with FIG. 2, signal 325 represents a minimum value of Rcvr_Out_1, which becomes approximately Vdd/2−Vdd/4=1/4 Vdd, when settled. Signal 330 represents an example of an unsettled Rcvr_Out_1, which can occur during the presence of a finger or other input object which also couples rapidly varying interference into receiver amplifier 121-1. This rapidly varying interference causes receiver amplifier 121-1 to slew and not achieve a settled state for Rcvr_Out_1. An accurate sample of signal 330 cannot be taken during sample period 340, because the signal is unsettled while the receiver amplifier 121-1 is operating in a non-linear, slewing state. Signal 335 represents an example of a saturated Rcvr_Out_1, which can occur due to the presence of very high interference being coupled into receiver amplifier 121-1 during positive drive. Any sample of signal 335 taken at sampling period 340 would be invalid because receiver amplifier 121-1 is operating in non-linear saturated state. Location 345 represents Rcvr_Out_1 during another reset.

Location 350 represents the beginning of negative drive of XMTR1. During negative drive, the example Rcvr_Out_1 signals shown are essentially a reflected version of the previously discussed signals. The only difference being the direction of the signals away from Vdd/2. Thus, for example, instead of occurring at 0 volts as during positive drive, saturation occurs at Vdd during negative drive. Signal 355 represents an example of baseline static present during the absence of a finger or other input object. Signal 360 indicates an example settled level of Rcvr_Out_1 when a finger or other input object is present and sensed. Signal 360 is settled enough that it can be accurately sampled during sample period 375. Following the example outlined above in conjunction with FIG. 2, signal 360 represents a maximum value of Rcvr_Out_1, which becomes approximately Vdd/2−Vdd/4=3/4 Vdd, when settled. Signal 365 represents an unsettled signal due to rapidly varying interference, coupled by a finger or other input object, which causes receiver amplifier 121-1 to slew rather than achieve a settled Rcvr_Out_1. An accurate sample of signal 365 cannot be taken during sample period 375, because the signal is unsettled due to receiver amplifier 121-1 operating in a non-linear, slewing state. Signal 370 represents saturation caused by high interference being coupled into receiver amplifier 121 during negative drive. Any sample of signal 370 taken at sampling period 375 would be invalid because receiver amplifier 121-1 is operating in non-linear saturated state.

As described herein, the Non-linearity_Out_1 signal from receiver amplifier 121-1 is set when receiver amplifier 121-1 is operating in a non-linear manner due to non-settling or due to saturation, both of which are caused by excessive interference (e.g., excessively spiky, rapidly varying, or high amplitude noise) being coupled with the Rcvr_1 input. It is appreciated, however, that off-the-shelf transconductance amplifiers are not equipped with an output to indicate operation in a non-linear manner. Thus, FIG. 4 is provided as an expanded block diagram illustrating an embodiment of implementing a capacitive sensor interference determining circuit with a receiver amplifier of a capacitive sensing device.

FIG. 4 is a block diagram of an example capacitive sensor interference determining circuit 400 implemented with a receiver amplifier of a capacitive sensor device, according to an embodiment. It is appreciated that FIG. 4, also represents a more detailed expanded block diagram of detail 120 of FIGS. 1 and 2. Capacitive interference determining circuit 400 comprises an amplifier 410, a current differential amplifier 430, and a current comparator 440. In one embodiment, an OR gate or other hardware logic, firmware logic, or software implemented in hardware is included to provide an interference indicator 450.

Amplifier 410 includes a first input for receiving a signal (e.g., Rcvr_1) from a receiver sensor channel of a capacitive sensor and a second input for a reference voltage (e.g., Vref). In one embodiment, amplifier 410 is a transconductance amplifier. It is appreciated that amplifier 410 acts as a receiver amplifier to amplify a signal, such as Rcvr_1, into an output signal Rcvr_Out_1. Thus, amplifier 410 operates in the manner previously described in conjunction with receiver amplifier 121-1. Circuit stage 415 is the interference determining processor portion of FIG. 4. Circuit stage 415 is coupled with amplifier 410 and detects non-linear operating conditions of amplifier 410, and thus determines the presence of too high of an interference level for measurement sampling, which occur due to interference on Rcvr_1 being coupled into amplifier 410.

Current differential amplifier 430 is coupled with amplifier 410 in the sense that the values of Ipos and Ineg (from the current sources inside of amplifier 410) are coupled as inputs to current differential amplifier 410. In one embodiment, the values of Ipos and Ineg are mirrored out of amplifier 410 by current mirror 420, as shown in FIG. 4. Current differential amplifier 410 outputs two differential currents representing differentials of currents, Ipos and Ineg, utilized in amplifier 410. As shown in FIG. 4, these outputs are represented as B1(Ipos−Ineg) and B2(Ineg−Ipos), where B1 and B2 represent constants associated with gain in current differential amplifier 430.

Current comparator 440 is a current comparator with hysteresis. Current comparator 440 is coupled with current differential amplifier 430 and receives the two outputs from current differential amplifier 430 as of the inputs to current comparator 440. Current comparator 440 compares the two differential currents received from current differential amplifier 430 (e.g., B1(Ipos−Ineg) and B2(Ineg−Ipos)) to two reference currents Iref_1 and Iref_2 to determine whether a non-linearity condition exists in amplifier 410. In one embodiment, the non-linearity comprises an occurrence of a saturation condition resulting in the saturation of the output (Rcvr_Out_1) of amplifier 410. Such saturation is typically caused by very high amplitude interference being coupled into the input amplifier 410 via Rcvr_1. In another embodiment, the non-linearity comprises an occurrence of an insufficient settling of the output (Rcvr_Out_1) of amplifier 410. A lack of settling is typically caused by rapidly varying interference being coupled into the input amplifier 410 via Rcvr_1, and causing amplifier 410 to slew.

The comparisons performed by current comparator 440 can reveal a non-linearity (due either to saturation or non-settling) because during a settled, non-saturated state of amplifier 410, Ipos and Ineg will be substantially equal to one another and thus have a difference equal to zero or near to zero. However, in a saturated state or in a non-settled state, Ipos and Ineg will diverge from one another beyond some threshold, which is measured by comparison to Iref_1 and Iref_2. Because of this, the values of Iref_1 and Iref_2 are set based on empirically determined values such a that they represent a threshold difference value (e.g., B1(Ipos−Ineg) and B2(Ineg−Ipos)) beyond which Ipos and Ineg are considered divergent enough from one another that amplifier 410 is operating in a non-linear state and therefore samples contemporaneously measured from of Rcvr_Out_1 will be invalid. The values of Iref_1 and Iref_2 can be predetermined and preset in hardware of controller 105 (e.g., unchangeable) or can be adjustable through an interface to controller 105 (e.g., programmable).

Current comparator 440 includes a first comparison output and a second comparison output. The first comparison output (Comp_1) outputs a result of comparing a first of the two differential currents to a first reference current of the two reference currents. For example, in one embodiment, Comp_1 represents a comparison of B1(Ipos−Ineg) to Iref_1 and is set when B1(Ipos−Ineg)>Iref_1. The second comparison output (Comp_2) outputs a result of comparing a second of the two differential currents to a second reference current of the two reference currents. For example, in one embodiment, Comp_2 represents a comparison of B2(Ineg−Ipos) to Iref_2, and is set when B2(Ineg−Ipos)>Iref_2. It is appreciated that amplifier 410 is considered to be operating in a non-linear fashion and thus the presence of too much interference for accurate sampling is determined when either Comp_1 or Comp_2 is set. In one embodiment, the values of Comp_1 and Comp_2 are communicatively coupled to a sampling circuit or logic (not illustrated) and serve as an indicator that interference is detected due to non-linear operation of amplifier 410. Thus, with reference to FIG. 3, if either Comp_1 or Comp_2 is set during a sampling period (340, 375), then the sampling circuit or logic is alerted that the sample should be considered invalid.

In one embodiment, interference indicator 450 is included to consolidate the outputs of current comparator 440 (or a plurality of current comparators that are each associated with a different receiver amplifier 121). As illustrated in FIG. 4, interference indicator 450 is a hardware indicator in the form of an OR gate with the first comparison output (Comp_1) and the second comparison output (Comp_2) as inputs. The output of interference indicator 450 is set when either of the first comparison output (Comp_1) or the second comparison output (Comp_2) is true. It is appreciated that a hardware interference indicator is shown by way of example only, and that in other embodiments interference indicator 450 is implemented in firmware (e.g., firmware of controller 105) or software that is implemented on controller 105 or with some other electronic device.

Example Method of Determining Interference in a Capacitance Sensor Device

FIG. 5 is a flow diagram of a method of determining interference in a capacitance sensor device, according to an embodiment. Elements of flow diagram 500 are described below, with reference to elements of FIG. 1-4.

At 510 of flow diagram 500, in one embodiment, the method transmits a signal on a transmitter sensor channel of a capacitive sensor. With reference to FIG. 1, in one embodiment, this comprises transmitting a drive signal with XMTR1 on a row 111 of sensor array 110 of capacitive sensor device 100.

At 520 of flow diagram 500, in one embodiment, the method receives the transmitted signal on a receiver sensor channel of the capacitive sensor, the receiver sensor channel being coupled with an amplifier. With reference to FIGS. 1, 2, and 4, in one embodiment, this comprises receiving the transmitted signal on a row 111 of sensor array 110. This is represented by the signal on Rcvr_1 being coupled as an input to receiver amplifier 121-1 in FIGS. 1 and 2 and to amplifier 410 in FIG. 4.

At 530 of flow diagram 500, in one embodiment, the method examines behavior of the amplifier for non-linearity to determine if a level of interference has been received by the receiver sensor channel in conjunction with receipt of the signal. With reference to FIG. 4, in one embodiment, this comprises comparing the values of internal current sources of the receiver amplifier to determine if a non-linearity condition exists in the operation of the receiver amplifier due to the presence of interference which causes either a saturation condition of the output or prevents settling of the output by a time when a sample is taken of the output. As illustrated in FIG. 4, in one embodiment, a current amplifier (e.g., current differential amplifier 430) is used to examine a magnitude of an output current of the amplifier by determining the differences between the values (Ipos and Ineg) of internal current sources of amplifier 410. In one embodiment, one or both of these difference magnitudes is compared, using current comparator 440, to one or more reference currents (Iref_1, Iref_2) to detect the occurrence of a non-linear operating condition of amplifier 410.

At 540 of flow diagram 500, in one embodiment, the method sets an indicator in response to an occurrence of a non-linearity in the receiver amplifier (e.g., receiver amplifier 121-1 in FIGS. 1 and 2 and amplifier 410 in FIG. 4). This indicator can comprise a hardware indicator, software indicator (implemented on hardware), or a firmware indicator (implemented on hardware). A hardware interference indicator 450 is illustrated as an OR gate in FIG. 4, with an output, Non-linearity_Out_1, that is set contemporaneously with when non-linear operation of amplifier 410 is determined to be taking place.

Example Method of Fabricating an Interference Determining Processor System for a Capacitive Sensor Device FIG. 6 is a flow diagram 600 of a method of fabricating an interference determining processor system for a capacitive sensor device, according to an embodiment. Elements of flow diagram 600 are described below, with reference to elements of FIGS. 1, 2, and 4. It is appreciated that the "coupling" described in flow diagram 600 can comprise electrically coupling and/or communicatively coupling items with one another.

At 610 of flow diagram 600, in one embodiment, the method couples an amplifier with a receiver sensor channel of the processor system. With reference to FIGS. 1, 2, and 4, this comprises, for example, coupling receiver amplifier 121-1 or amplifier 410 with a receive channel that is electrically coupled with a column 112 of sensor array 110 in capacitive sensor device 100. As illustrated in FIGS. 1, 2, and 4 the amplifier (121-1, 410) includes a first input for receiving a signal (e.g., Rcvr_1) from the receiver sensor channel and a second input for a reference voltage (Vref). In one embodiment, the processor system is represented as circuit stage 415 of FIG. 4.

At 620 of flow diagram 600, in one embodiment, the method couples a current differential amplifier with an output of the amplifier. As illustrated in FIG. 4, this can comprise mirroring out the currents Ipos and Ineg from amplifier 410, using current mirror 420, and coupling these mirrored currents as inputs to current differential amplifier 430. As illustrated in the embodiment of FIG. 4, amplifier 410 is a transconductance amplifier. The difference between these currents will comprise the output current supplied through Rcvr_Out_1 of amplifier 410. Current differential amplifier 420 outputs two differential currents, B1(Ipos–Ineg) and B2(Ineg–Ipos), representing differentials of the currents, Ipos and Ineg, utilized in amplifier 410.

At 630 of flow diagram 600, in one embodiment, the method couples a current comparator with the differential amplifier. This is illustrated in FIG. 4, with current comparator 440 receiving the current differential outputs, B1(Ipos–Ineg) and B2(Ineg–Ipos), from current differential amplifier 430 as inputs to compare with reference currents ref and Iref_1 and Iref_2. The current comparator compares the two differential currents to two reference currents to determine whether a non-linearity exists in the receiver amplifier (amplifier 410). For example, as illustrated by the embodiment of FIG. 4, current comparator 440 compares B1(Ipos–Ineg) with Iref_1 and compares B2(Ineg–Ipos) with Iref_2 to determine whether a non-linearity exists in the receiver amplifier (e.g., amplifier 410). The non-linearity can represent an occurrence of a saturation condition of the output of amplifier 410 or an occurrence of an insufficient settling of the output of amplifier 410. If either of these conditions exists with the signal of Rcvr_Out_1, then amplifier 410 is operating in a non-linear range and a sample of the output measured during this non-linear operation will be invalid due to the presence of interference causing either saturation of the output or preventing sufficient settling of the output.

At 640 of flow diagram 600, in one embodiment, the method also couples an interference indicator with the current comparator. As previously described, the interference indicator can be implemented with hardware, a combination of firmware and hardware, or a combination of software and hardware. For purposes of example, and not of limitation, hardware interference indicator 450 is illustrated in FIG. 4. The interference indicator (e.g., interference indicator 450) outputs an interference indication signal in response to comparisons of the reference currents and the differential currents indicating presence of a non-linear operating condition in amplifier 410. Thus for example, if either Comp_1 or Comp_2 of current comparator 440 is set, then Non-linearity_Out_1 of interference indicator 450 will be set to indicate presence of non-linearity due to the presence of interference. However, when neither Comp_1 nor Comp_2 is set, then Non-linearity_Out_1 will not be set.

The foregoing descriptions of specific embodiments have been presented for purposes of illustration and description. They are not intended to be exhaustive or to limit the presented technology to the precise forms disclosed, and obviously many modifications and variations are possible in light of the above teaching. The embodiments were chosen and described in order to best explain the principles of the presented technology and its practical application, to thereby enable others skilled in the art to best utilize the presented technology and various embodiments with various modifications as are suited to the particular use contemplated. It is intended that the scope of the present technology be defined by the claims appended hereto and their equivalents.

What is claimed is:

1. A processing system for a capacitive input device, wherein said capacitive input device comprises a plurality of sensor electrodes configured to detect input objects in a sensing region, said processing system configured to:
    transmit a signal on a transmitter sensor channel of said capacitive input device;
    receive said signal on a receiver sensor channel of said capacitive input device, wherein said receiver sensor channel is coupled with an amplifier; and
    determine a level of interference received by said receiver sensor channel in conjunction with receipt of said signal by using a current amplifier to examine a magnitude of an output current of said amplifier and comparing said magnitude to a reference current to detect said interference.

2. The processing system of claim 1, further configured to:
    examine behavior of said amplifier for non-linearity to determine a level of interference received by said receiver sensor channel in conjunction with receipt of said signal.

3. The processing system of claim 1, wherein said capacitive input device further comprises a display overlapping said sensing region.

4. The processing system of claim 1, wherein said processing system configured to determine a level of interference received by said sensor channel in conjunction with receipt of said signal by using a current amplifier to examine a magnitude of an output current of said amplifier and comparing said magnitude to a reference current to detect said interference further comprises said processing system being configured to:
    determine a saturation condition of said amplifier exists.

5. The processing system of claim 1, wherein said processing system configured to determine a level of interference received by said sensor channel in conjunction with receipt of said signal by using a current amplifier to examine a magnitude of an output current of said amplifier and comparing said magnitude to a reference current to detect said interference further comprises said processing system being configured to:
    determine insufficient settling of an output current of said amplifier exists.

6. A capacitive input device comprising:
    a sensing region;
    a plurality of sensor electrodes configured to detect input objects in said sensing region of said capacitive input device; and
    a processing system coupled with said plurality of sensor electrodes and configured to:
        transmit a signal on a transmitter sensor channel of said capacitive input device;
        receive said signal on a receiver sensor channel of said capacitive input device, wherein said receiver sensor channel is coupled with an amplifier; and
        determine a level of interference received by said receiver sensor channel in conjunction with receipt of said signal by using a current amplifier to examine a magnitude of an output current of said amplifier and comparing said magnitude to a reference current to detect said interference.

7. The capacitive input device of claim 6, further comprising:
    a display overlapping said sensing region.

8. The capacitive input device of claim 6, wherein said processing system is further configured to:
    examine behavior of said amplifier for non-linearity to determine a level of interference received by said receiver sensor channel in conjunction with receipt of said signal.

9. The capacitive input device of claim 6, wherein said processing system is further configured to:
    determine a saturation condition of said amplifier exists.

10. The capacitive input device of claim 6, wherein said processing system is further configured to:
    determine insufficient settling of an output current of said amplifier exists.

* * * * *